(12) United States Patent
MacLeod

(10) Patent No.: US 9,077,363 B2
(45) Date of Patent: Jul. 7, 2015

(54) STOCHASTIC ENCODING IN ANALOG TO DIGITAL CONVERSION

(71) Applicant: Thomas M. MacLeod, Arlington, NC (US)

(72) Inventor: Thomas M. MacLeod, Arlington, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 70 days.

(21) Appl. No.: 14/095,690

(22) Filed: Dec. 3, 2013

(65) Prior Publication Data

US 2015/0155878 A1 Jun. 4, 2015

(51) Int. Cl.
*H03M 1/10* (2006.01)
*H03M 1/12* (2006.01)
*H03M 1/66* (2006.01)
*H03M 1/08* (2006.01)

(52) U.S. Cl.
CPC .............. *H03M 1/1245* (2013.01); *H03M 1/66* (2013.01); *H03M 1/08* (2013.01); *H03M 1/1009* (2013.01)

(58) Field of Classification Search
CPC ........... H03M 1/00; H03M 1/10; H03M 1/04; H03M 1/66; H03M 1/08; H03M 1/1245; H03M 1/1009; H03M 7/26; H04R 3/005; G06N 7/005; G06F 7/58; G06F 7/70
USPC ........... 341/120–155; 370/291; 375/285, 346; 708/490, 250, 523, 270, 232
See application file for complete search history.

(56) References Cited

U.S. PATENT DOCUMENTS

| | | | | |
|---|---|---|---|---|
| 5,113,389 A | * | 5/1992 | Cox | 370/291 |
| 5,170,071 A | * | 12/1992 | Shreve | 706/43 |
| 5,187,481 A | | 2/1993 | Hiller | |
| 5,412,587 A | * | 5/1995 | Holt et al. | 708/250 |
| 5,990,815 A | | 11/1999 | Linder et al. | |
| 6,268,814 B1 | | 7/2001 | Kolsrud | |
| 6,369,727 B1 | | 4/2002 | Vincze | |
| 6,411,240 B1 | | 6/2002 | Greitschus | |
| 6,745,219 B1 | * | 6/2004 | Zelkin | 708/490 |
| 6,804,501 B1 | | 10/2004 | Bradley et al. | |
| 7,356,150 B2 | * | 4/2008 | Ejima et al. | 381/61 |
| 7,439,890 B2 | | 10/2008 | Schreier et al. | |
| 7,755,523 B2 | | 7/2010 | Hwang et al. | |
| 8,320,453 B2 | * | 11/2012 | Jeon et al. | 375/240.16 |
| 2002/0070803 A1 | | 6/2002 | Rzyski | |
| 2009/0154617 A1 | | 6/2009 | Jung et al. | |
| 2009/0161802 A1 | | 6/2009 | Malla et al. | |
| 2010/0090763 A1 | | 4/2010 | Benhamouda et al. | |
| 2011/0150237 A1 | | 6/2011 | Nagasue et al. | |

* cited by examiner

*Primary Examiner* — Lam T Mai
(74) *Attorney, Agent, or Firm* — Kenyon & Kenyon, LLP

(57) ABSTRACT

A method and system for encoding an analog signal on a stochastic signal, the encoded signal then converted to a digital signal by an analog to digital converter, the analog to digital converter thereafter decoding from the encoded signal a digital signal, which corresponds to the analog signal. The stochastic signal may be a noise signal shaped to a Gaussian normal curve. An encoding process is performed by a multiplication circuit, which multiplies the stochastic signal by the analog signal, producing a product signal for an analog to digital conversion. During analog to digital conversion, the product signal is decoded. The decoding is performed using an arithmetic operation, which may be a Root Sum Square function or a Root Means Square function. The decoded signal is then mapped to account for offset error, gain error, and endpoint adjustment. The result is a decoded digital signal corresponding to the analog signal.

27 Claims, 3 Drawing Sheets

STOCHASTIC ENCODING IN ANALOG TO DIGITAL CONVERSION

FIELD OF THE INVENTION

The present invention relates to a method and system for encoding an analog signal on a stochastic signal, the encoded signal then converted to a digital signal by an analog to digital converter, the analog to digital converter thereafter decoding from the encoded signal a digital signal, which corresponds to the analog signal.

BACKGROUND INFORMATION

Various types of analog to digital converters exist to perform high-fidelity conversion of analog signals into digital form. Generally, such analog to digital converters accept as input a continuous analog signal and then provide, as output, a digital signal that corresponds to some measured aspect of the continuous analog signal. Although the measured aspect of the continuous signal is typically amplitude, the measured aspect may represent other features of the signal. In some instances, the continuous analog signal is a voltage signal, and in other instances, the continuous analog signal is a current signal. The produced digital signal is by definition discrete in time and discrete in amplitude.

Various types of analog to digital converters exist, each with varying circuit design. Some of these analog to digital converters include successive-approximators, integrators (including $\Delta\text{-}\Sigma$ converters), flash, and subrangers. Each type of analog to digital converter has a characteristic that may make its application beneficial to users based at least on one of its linearity, resolution, bandwidth, cost, and signal to noise ratio.

One general problem with analog to digital converters is that the conversion process introduces noise. Noise can greatly interfere with the output signal, and it may result in severe signal degradation or signal loss. Signal to noise ratio (SNR) expresses the accuracy of the digital output relative to the amount of noise that the analog to digital conversion process has introduced; so customers who require analog to digital converters with low noise on the signal select converters with high signal to noise ratios (SNR). In some converters, the noise may be filtered out of the signal, but the later filtration process takes additional time, which is not often desirable when fast conversion speed is also desired. The invention presented provides a solution to cope with excessive noise without extra filtering by encoding the desired analog signal on a stochastic signal prior to the conversion process. Furthermore, the invention provides high-fidelity conversion of the signal based on the number of samples that can be taken. The invention presented may be especially advantageous as an alternative to DC or low bandwidth analog to digital converter topologies.

SUMMARY

A method and system are described in the present invention to implement encoding an analog signal on a stochastic signal for conversion by an analog to digital converter, and thereafter, decoding from the encoded signal a digital signal that corresponds to the analog signal. According to the present invention, at least two signals including an analog signal and a stochastic signal are fed into circuitry capable of performing a multiplication of the two signals. The stochastic signal source, which is also part of the present invention, generates the stochastic signal being fed into the multiplication circuitry. The product of the two signals is then directed into an analog to digital processing and decoding system, which returns as output a decoded digital signal corresponding to the analog signal.

DETAILED DESCRIPTION

Figure 1:
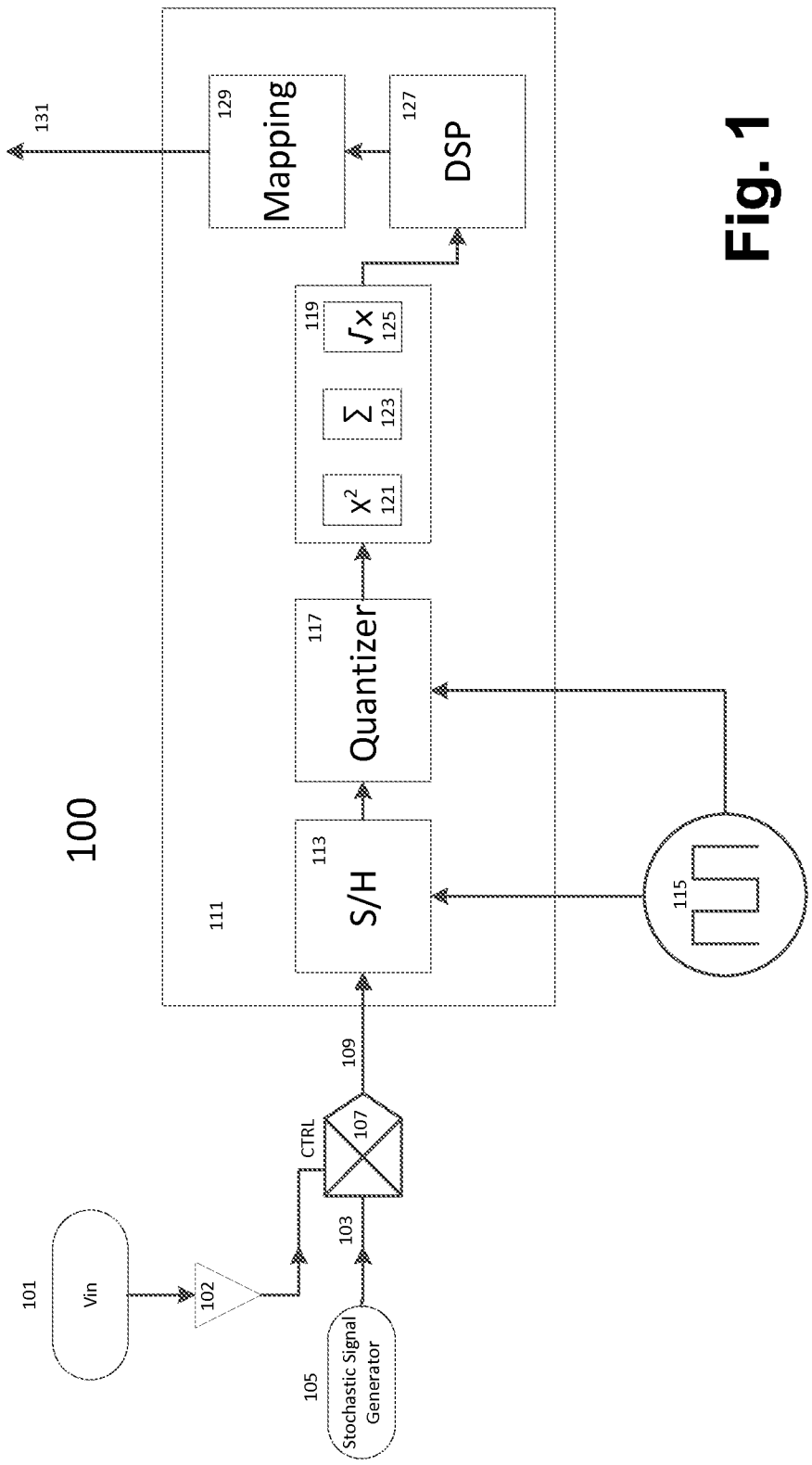
FIG. 1 shows a system 100 having the components for the present encoding and decoding aspects of the invention.

The stochastic signal discussed herein may be exemplified in one embodiment by a white normalized noise, meaning a noise signal fitting a Gaussian normal curve. A Gaussian normal curve is typically represented by the following formula:

$$f(x) = \frac{1}{\sigma\sqrt{2\pi}} e^{-\frac{(x-\mu)^2}{2\sigma^2}}$$

In the Gaussian normal formula above, $\sigma$ represents the signal's standard deviation; $\sigma^2$ represents the signal's variance; and $\mu$ represents the signal's mean.

For a normal distribution, the signal's statistical standard deviation is equal to the Root Means Square value of the signal, $f(x)$, meaning $\sigma = \text{RMS}$. As a result of this relationship, the invention provides high levels of accuracy when there is no DC component to the noise signal, or the DC component is small and may be considered negligible. The Root Means Square, sometimes called a "quadratic mean," can measure the magnitude of a varying quantity, wherein the quantity can be error. The RMS value may be calculated for either a continuous waveform or for discrete values by application of the following formula:

$$X_{RMS} = \sqrt{\frac{1}{n}(x_1^2 + x_2^2 + x_3^2 + \ldots + x_n^2)}$$

In the RMS formula above, $\{x_1, x_2, x_3, \ldots, x_n\}$ represent a series of samples, and n represents the total number of samples taken.

Another commonly employed probabilistic determination, applicable to the invention, is the Root Sum Square, which is also sometimes called "addition in quadrature." The Root Sum Square measures the total magnitude of a varying quantity, which can be error. The RSS value can also be calculated for a continuous waveform or for discrete values. The RSS is typically represented by the following formula:

$$X_{RSS} = \sqrt{(x_1^2 + x_2^2 + x_3^2 + \ldots + x_n^2)}$$

In the RSS formula above, $\{x_1, x_2, x_3, \ldots, x_n\}$ represent a series of samples, and n represents the total number of samples taken.

By implementing circuitry that multiplies the two signals, the analog signal is encoded onto the noise signal as the varying quantity and it may be described as the "error" of the noise signal. The encoded noise signal is a power measurement of the noise signal and it is therefore proportional to the analog signal. After implementing the encoding process, the encoded noise signal is then passed through the decoding analog to digital converter, which decodes the analog signal from the encoded noise signal in the form of a digital output.

The analog to digital converter decodes the encoded noise signal by processing the encoded noise signal through the following operations: a sample and hold, a quantizer, an algebraic function, and a signal mapping. For decoding the encoded noise signal, the algebraic function must deconstruct the "error" of the noise signal. In one embodiment, the deconstruction may be performed by performing a Root Sum Square function. In another embodiment, the deconstruction may be performed by applying a Root Means Square function and then further manipulating the signal through digital processing to remove the $$\sqrt{\frac{1}{n}}$$

element.

Although the stochastic signal discussed above and herein may be specified as a noise signal fitting a Gaussian normal curve, the noise signal fitting a Gaussian normal curve is only one embodiment of the invention at large. Any stochastic signal or any signal following a set of known probabilistic rules, may be selected as the noise signal, and used to encode and decode that noise signal to enable this method of analog to digital conversion.

Figure 2A:
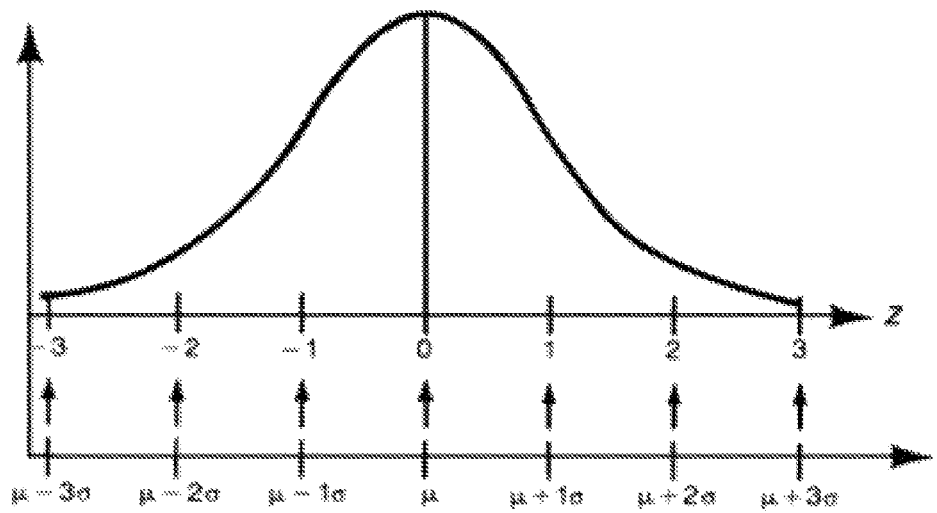
FIG. 2A shows a Gaussian normal distribution curve and characteristics of the curve.
Figure 2B:
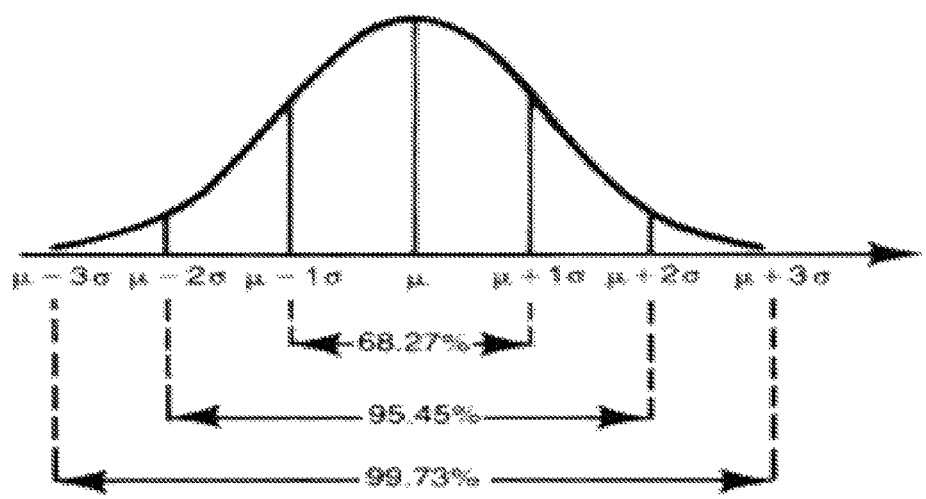
FIG. 2B shows further characteristics typical of a Gaussian normal distribution curve.

In FIGS. 2A and 2B, two curves depict a Gaussian normal distribution. In FIG. 2A, the normal distribution is plotted against a "Z" axis $$\left(\text{where } Z = \frac{X - \mu}{\sigma}\right),$$

for depiction convenience, that illustrate a σ of 1 and a μ of 0. As was described previously, σ represents the signal's standard deviation and μ represents the signal's mean. In FIG. 2B, the same normal distribution is presented, and the plot further shows some typical characteristics of a normal distribution. Normal distributions have symmetry about their center, and 50% of the data is above the mean while the other 50% of the data is below the mean. The distribution of the signal's data further varies in a way that can be predicted, sometimes called the "Empirical Rule" (in the Z domain) as is depicted in FIG. 2B. The plot shows that 68.27% of the signal's values fall in one standard deviation (between Z values of μ−1σ and μ+1σ), and the plot further shows other categorical distributions of the signal's data. The standard deviation of the normal distribution is also equal to the signal's Root Mean Square. In one embodiment of the invention, a noise signal fitting a Gaussian normal curve like those in FIG. 2A and FIG. 2B is selected as the stochastic signal, which is then to be multiplied by an analog signal.

To implement the analog to digital converter, at least two signals, including an analog input signal and a stochastic signal are set as the inputs to multiplication circuitry. In FIG. 1, the analog input signal may be an analog voltage input signal, $V_{in}$ 101, and the stochastic signal may be S(σ) 103, a noise signal fitting a Gaussian normal curve.

S(σ) 103, in this embodiment, is generated as a signal from a stochastic signal generator 105, which may in part include an analog noise generator such as noise diode. However, in other embodiments the noise signal may be created from a plurality of methods known in the art that are either based in analog or digital components. In one embodiment, the noise signal produced may be analog, yet it may be formed as a result of a digital to analog conversion of series of bits generated from a digital random number generator fitting a Gaussian normal bell curve (pseudo-random normalized noise). As shown in the embodiment of FIG. 1 with signal S(σ) 103, the noise signal is generated independent of the analog input signal.

According to the invention, $V_{in}$ 101 may already include noise in the signal, as noise is inherent in most analog signals. In another embodiment, the analog signal may have already been filtered to exclude noise prior to its selection as an input to the multiplication circuitry. In an exemplary aspect of the invention, the analog input signal is a signal having a low frequency or a DC signal with noise. The $V_{in}$ 101 may be fed into an input buffer 102.

According to the invention, signals $V_{in}$ 101 and S(σ) 103 are fed into the multiplication circuitry. The multiplication circuitry multiplies the signals $V_{in}$ 101 and S(σ) 103, generating a multiplied signal, Fout(σ) 109, which is the analog product signal but also may be described as an encoded noise signal. In an example embodiment, the multiplication may be performed by Variable Gain Amplifier (VGA) 107 circuitry. In the example embodiment, $V_{in}$ 101 has been set as the control signal, or gain, for the VGA 107. However, either $V_{in}$ 101 or S(σ) 103 may act as the control signal due to fundamental principles of multiplication.

According to a further embodiment of the invention, the multiplication may occur in the voltage domain. In this particular embodiment, the continuous analog input signal contains data related to voltage levels. In another embodiment of the invention, the multiplication may occur in the current domain. In this alternative embodiment, the continuous analog input signal contains data related to current levels that are determinable by the application of a load. Furthermore, the multiplication circuitry may include any number of a multiplicity of analog circuit elements known in the related art, and is not limited to Variable Gain Amplifiers.

After Fout(σ) 109 is generated, Fout(σ) 109 is supplied to the analog to digital processing and decoding system 111. As discussed above, in the analog to digital processing and decoding system 111, Fout(σ) 109 is processed by the following operations: a sample and hold, a quantizer, an algebraic function, and a signal mapping.

During the analog to digital processing and decoding 111, Fout(σ) 109 is first operated on by a "sample and hold" circuit 113. The sample and hold circuit may be implemented in a multiplicity of ways, as they are established in the relevant art. In one embodiment, a buffer is used to temporarily store data from signal Fout(σ) 109.

After the "sample and hold" operation 113, the signal may be quantized by a quantizer operation 117, which is timed by synchronous clock 115. During the temporary data store initiated by the sample and hold, the value stored in the buffer is quantized. Furthermore, in another embodiment, the sample and hold process may be implemented as part of the quantizer system. The rate of sampling is controlled at a speed set according to an associated clock 115. In an exemplary embodiment of the invention, the signal is clocked at a high sample rate, preferably by using a 16 bit quantizer, so as to produce a significant number of output samples to make statistically meaningful power measurements.

Thereafter, the signal is passed through an algebraic operation 119 that decodes the encoded values from the noise signal. The algebraic operation 119 may be considered an arithmetic means for producing a decoded digital output signal, with the arithmetic means being performed by a structural unit such as a processor or a control unit. In this embodiment, the algebraic operation performed is the equivalent of a Root Sum Square operation. An embodiment of the Root Sum Square operation may be implemented by a squaring function 121, a summing function 123, and a square root function 125. In this particular embodiment of the Root Sum Square, additional digital processing 127 would thereafter account for a dividing function, in which the divisor is the square root of the number of samples taken, n. In other embodiments, a Root Sum Square operation may be implemented in a multiplicity of ways.

In a further embodiment, the algebra performed is the equivalent of a Root Means Square operation. The Root Means Square operation may be considered another arithmetic means for producing a decoded digital output signal, with the arithmetic means being performed by a structural unit such as a processor or a control unit. An embodiment of the Root Means Square operation may be implemented by a squaring function, a summing function, a square root function, and multiplying the signal by a factor, in which the divisor of the multiplying factor is the square root of the number of samples taken, n. In other embodiments, a Root Means Square operation may be implemented in a multiplicity of ways.

In any algebraic operation performed, the signal is decoded to represent the initial $V_{in}$ 101 signal. In an embodiment of the invention, a mapping function performs some or all of the algebra required to decode the signal.

Thereafter, the decoded signal is mapped by a mapping function 129 to accurately correspond to the initial $V_{in}$ 101 signal. In one embodiment, the mapping may be performed with the use of a decimator.

In another embodiment, the mapping function 129 is implemented in software, including at least in a hardware description language, such as Verilog. The coding language used to assist in the software implementation may require a series of look up tables for use in the mapping. According to an exemplary embodiment, the mapping process requires endpoint adjustment. To adjust endpoints of the $V_{in}$ 101, the input signal's range from its minimum to its maximum must be separated into a selected number of levels. The minimum $V_{in}$ 101 value is mapped to a level representing no noise signal ($\sigma=0$), and the maximum $V_{in}$ 101 value is mapped to a level representing the highest noise signal ($\sigma=2^N-1$), where N is the desired resolution of the ADC mapping in bits. For example, a desired 8 bit resolution would be possible with 256 quantization levels. The lowest quantization level would be 0, and the highest level would be 255 ($2^8-1$). The mapping function 129 is employed in other embodiments to further increase the accuracy of the signal by removing errant noise. Errant noise could either originate from error initially included on the $V_{in}$ 101 signal or it might originate from the multiplication circuitry such as the VGA 207. The mapping function 129 is, in this embodiment, calibrated to remove the noise. Constant error noise on the input signal $V_{in}$ 101 is calibrated as offset error. Noise introduced by the VGA 207 is calibrated by endpoint correction, which involves removing from the signal the gain error.

In an advantageous embodiment of the invention, the mapping function 129 further relinearizes the Integral Non-Linearity (INL) of the signal. Alternatively, components of the system may be subjected to calibration to restore their INL. System components that may be susceptible to recalibration include at least the multiplication circuit and the quantizer. For example, at low resolutions, the quantizer may risk altering the analog to digital converter's overall INL.

In another embodiment of the invention, more than one digital processing system is in place. The multiplicity of digital sampling systems may be instantiated to perform the same operations as discussed previously, but in parallel. In this embodiment, the multiplicity of digital sampling systems would quantize the same continuous analog signal at different edges of the clock, and the quantized signals would be averaged, providing for an improvement on the output integrity. In another embodiment of the invention, if extreme precision is desired, a plurality of the stochastic encoding analog to digital converters discussed herein may be cascaded.

In yet another embodiment, the sample and hold circuit and the quantizer operation may be replaced with a stochastic encoding analog to digital converter, such as system 100, which operates at a faster clock rate than the stochastic encoding analog to digital converter in which it is embedded. This particular embodiment can further include another embedded stochastic encoding analog to digital converter in the place of both the sample and hold circuit and the quantizer operation of the embedded stochastic encoding analog to digital converter. The layers of embedded stochastic encoding analog to digital converters are implemented as desired, so long as the embedded levels are sampled at a faster clock rate than the previous level. The output of the mapping function 129 is a decoded digital output signal 131, which is a string of bits. The decoded digital output signal 131 is proportional to the power measurement of the initial analog signal $V_{in}$ 101.

Figure 3:
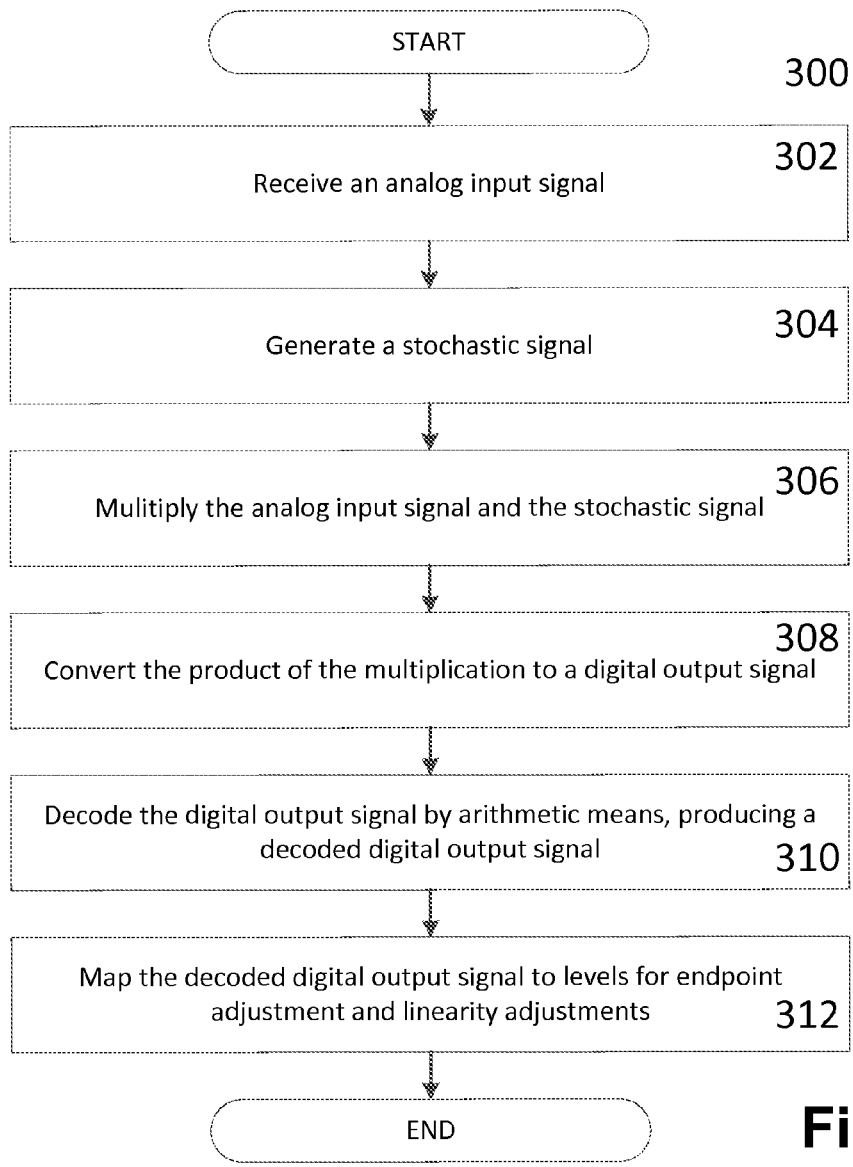
FIG. 3 shows a flow chart detailing the method 300 of encoding and decoding according to the present invention.

FIG. 3 is a flow diagram 300 illustrating a method for stochastic coding in an analog to digital conversion. When the initial analog signal $V_{in}$ 201 is held by a buffer, and then selected as an input to the multiplication circuitry, such as the VGA 207, the method begins at step 302, by receiving an analog input signal. At 304, the system generates the stochastic signal, $S(\sigma)$ 203, from a noise diode 205. Notably, the stochastic signal generation is performed without the use of $V_{in}$ 201. At step 306, the two signals 201 and 203 are multiplied, generating an analog product signal, which is then converted by an analog to digital converter to a digital output signal at step 308. The digital output signal is then decoded in step 310, by arithmetic means which may include Root Means Square or Root Sum Square operations, producing a decoded digital output signal. At step 312, the decoded digital output signal is appropriately mapped to levels to account for endpoint adjustment and linearity adjustments. The output from step 312 is the decoded digital output signal 231.

What is claimed is:

1. An electronic circuit for stochastically encoding an analog input signal to produce a decoded digital output signal, comprising:
   an analog multiplication circuit, the analog multiplication circuit for receiving an analog input signal and a stochastic signal and for multiplying the analog input signal and the stochastic signal to generate an analog product signal;
   at least one analog to digital converter for converting the analog product signal into a digital output signal; and
   a control circuit for performing an arithmetic operation for decoding the digital output signal.

2. The electronic circuit of claim 1, wherein the stochastic signal is produced by a stochastic signal source.

3. The electronic circuit of claim 1, further comprising a control circuit for mapping the digital output signal to a quantized digital output signal.

4. The electronic circuit of claim 1, wherein the stochastic signal is a noise signal shaped to a Gaussian normal curve.

5. The electronic circuit of claim 1, wherein the analog multiplication circuit is a Variable Gain Amplifier.

6. The electronic circuit of claim 1, wherein the at least one analog to digital converter includes a sample and hold circuit that samples the analog product signal and holds its value and a quantizer that quantizes the analog product signal to generate the digital output signal.

7. The electronic circuit of claim 1, wherein the control circuit performs the arithmetic operation by implementing a Root Sum Square operation, including: a squaring function, a summing function, and a square root function.

8. The electronic circuit of claim 1, wherein the control circuit performs the arithmetic means by implementing a Root Means Square operation, including: a squaring function, a summing function, a square root function, and a multiplying function.

9. The electronic circuit of claim 1, wherein the analog input signal is at least one of a voltage signal and a current signal.

10. The electronic circuit of claim 5, wherein the control circuit performs a further arithmetic operation by applying a multiplying function, wherein a divisor of a multiplying factor is a square root of a number of samples taken.

11. The electronic circuit of claim 2, wherein the stochastic signal source comprises at least one noise diode.

12. The electronic circuit of claim 2, wherein the stochastic signal source is an output from a digital to analog converter, where an input to the digital to analog converter being a pseudo-random noise digital signal.

13. The electronic circuit of claim 1, wherein the analog multiplication circuit multiplies the analog input signal and the stochastic signal in at least either a current domain or a voltage domain.

14. The electronic circuit of claim 1, wherein the at least one analog to digital converter for converting the analog product signal into a digital output signal includes a sample and hold circuit that samples the analog product signal and holds its value.

15. The electronic circuit of claim 1, wherein the at least one analog to digital converter for converting the analog product signal into a digital output signal includes a quantizer that quantizes the analog product signal to generate the digital output signal.

16. The electronic circuit of claim 3, wherein the control circuit mapping includes at least one of a decimator, a programming language, and a series of look up tables.

17. The electronic circuit of claim 16, wherein the control circuit mapping performs endpoint adjustment.

18. The electronic circuit of claim 16, wherein the control circuit mapping relinearizes an Integral Non-Linearity (INL) of the digital output signal.

19. The electronic circuit of claim 1, wherein the at least one analog to digital converter is in parallel to an at least one additional analog to digital converter for converting the analog product signal into a digital output signal.

20. The electronic circuit of claim 1, wherein the at least one analog to digital converter is cascaded with an at least one additional analog to digital converter for converting the analog product signal into a digital output signal.

21. An analog to digital converter that performs stochastic encoding of an analog input signal and decodes a digital output signal, comprising:
an input buffer to receive the analog input signal;
a stochastic signal source, wherein the stochastic signal source produces a stochastic signal independently from the analog input signal;
an analog multiplication circuit connected to the input buffer and the stochastic signal source, for multiplying the analog input signal and the stochastic signal to generate an analog product signal;
a sample and hold circuit that samples the analog product signal and holds its value;
a quantizer that quantizes the analog product signal to generate the digital output signal; and
a control circuit for performing an arithmetic operation for decoding the digital output signal.

22. A method for stochastic coding in an analog to digital conversion, comprising the steps of:
receiving an analog input signal;
generating a stochastic signal, independent of the analog input signal;
multiplying the analog signal by the stochastic signal, thereby generating an analog product signal;
converting the analog product signal to a digital output signal with an analog to digital converter;
decoding the digital output signal by an arithmetic operation for producing a decoded digital output signal; and
mapping the decoded digital output signal to provide a power measurement of the analog input signal.

23. An electronic circuit for stochastically encoding an analog input signal to produce a decoded digital output signal, comprising:
an input buffer to receive the analog input signal;
a stochastic signal source, wherein the stochastic signal source produces a stochastic signal independently from the analog input signal;
an analog multiplication circuit connected to the input buffer and the stochastic signal source, for multiplying the analog input signal and the stochastic signal to generate an analog product signal;
at least one analog to digital converter for converting the analog product signal into a digital output signal; and
a control circuit for performing an arithmetic operation for decoding the digital output signal.

24. The electronic circuit of claim 7, further comprising a control circuit for performing additional digital processing to account for a dividing function, in which the divisor is the square root of the number of samples taken, n.

25. The electronic circuit of claim 6, wherein the sample and hold circuit and the quantizer are replaced with an embedded electronic circuit for stochastically encoding an analog input signal to produce a decoded digital output signal, comprising:
an embedded analog multiplication circuit, the embedded analog multiplication circuit for receiving an analog input signal and a stochastic signal and for multiplying the analog input signal and the stochastic signal to generate an embedded analog product signal;
at least one embedded analog to digital converter for converting the embedded analog product signal into an embedded digital output signal; and
an embedded control circuit for performing an arithmetic operation for decoding the embedded digital output signal.

26. The electronic circuit of claim 16, wherein the control circuit mapping calibrates out a gain error.

27. The electronic circuit of claim 16, wherein the control circuit mapping calibrates out an offset error.

* * * * *